United States Patent [19]
Watanabe et al.

[11] Patent Number: 5,917,643
[45] Date of Patent: *Jun. 29, 1999

[54] OPTICAL ISOLATOR

[75] Inventors: Toshiaki Watanabe; Toshihiko Ryuo, both of Gunma, Japan

[73] Assignee: Shin-Etsu Chemical Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/947,840

[22] Filed: Oct. 9, 1997

Related U.S. Application Data

[63] Continuation of application No. 08/789,737, Jan. 27, 1997, abandoned, which is a continuation of application No. 08/524,832, Sep. 5, 1995, abandoned, which is a continuation of application No. 08/207,540, Mar. 7, 1994, abandoned.

[30] Foreign Application Priority Data

Mar. 12, 1993 [JP] Japan .................................. 5-051702

[51] Int. Cl.$^6$ ............................... G02F 1/09; G02B 5/30; G02B 27/28
[52] U.S. Cl. ......................... 359/281; 359/282; 359/484; 372/703
[58] Field of Search ..................................... 359/281, 282, 359/483, 484, 501; 385/6; 372/703

[56] References Cited

U.S. PATENT DOCUMENTS

| | | | |
|---|---|---|---|
| 4,272,158 | 6/1981 | Johnston, Jr. et al. | 372/703 |
| 4,549,795 | 10/1985 | Simms | 359/483 |
| 4,756,607 | 7/1988 | Watanabe et al. | 359/484 |
| 4,804,256 | 2/1989 | Wilson | 359/484 |
| 5,040,863 | 8/1991 | Kawakami et al. | 359/484 |
| 5,074,682 | 12/1991 | Uno et al. | 385/33 |
| 5,076,675 | 12/1991 | Kusaka et al. | 359/488 |
| 5,122,907 | 6/1992 | Slocum | 359/486 |
| 5,127,072 | 6/1992 | Blauvelt et al. | 372/38 |
| 5,128,956 | 7/1992 | Aoki et al. | 372/703 |
| 5,452,122 | 9/1995 | Tsuneda et al. | 372/703 |

FOREIGN PATENT DOCUMENTS

| | | | |
|---|---|---|---|
| 0242915 | 10/1987 | Japan | 359/484 |
| 62-298195 | 12/1987 | Japan | 372/703 |
| 0074524 | 3/1989 | Japan | 359/484 |
| 0302319 | 12/1989 | Japan | 372/703 |
| 0114229 | 4/1990 | Japan | 372/703 |
| 0137616 | 6/1991 | Japan | 372/703 |
| 0148621 | 6/1991 | Japan | 372/703 |
| 4235524 | 8/1992 | Japan | 372/703 |
| 4338916 | 11/1992 | Japan | 372/703 |

*Primary Examiner*—Ricky D. Shafer
*Attorney, Agent, or Firm*—McAulay Nissen Goldberg Kiel & Hand, LLP

[57] ABSTRACT

An optical isolator has a high ratio of the quantity of signals S to that of noises N (S/N ratio) and can be miniaturized such a size that it can easily be incorporated into a laser module. The optical isolator 1 according to the present invention is one to be connected to a semiconductor laser 11 having a linear polarization plane and comprises a Faraday's rotator 5 and a magnetic material 4 for establishing a magnetic field around the rotor on the light-incident side of the isolator and an optical material 6 for polarization on the light-outputting side thereof. In particular, the optical isolator 1 of the present invention is one to be connected to a semiconductor laser 11 having a linear polarization plane while aligning a polarization direction guide 3 of the isolator with the semiconductor laser 11, comprises a Faraday's rotator 5 whose light-incident and -outputting sides are desirably inclined with respect to the optical path and an annular magnetic material 4 surrounding the rotator 5, on the light-incident side of the isolator and an optical material 6 for polarization, on the light-outputting side thereof, whose light-incident and -outputting sides are desirably inclined with respect to the optical path, and the optical material for polarization is more desirably made of a metal-containing glass material.

5 Claims, 3 Drawing Sheets

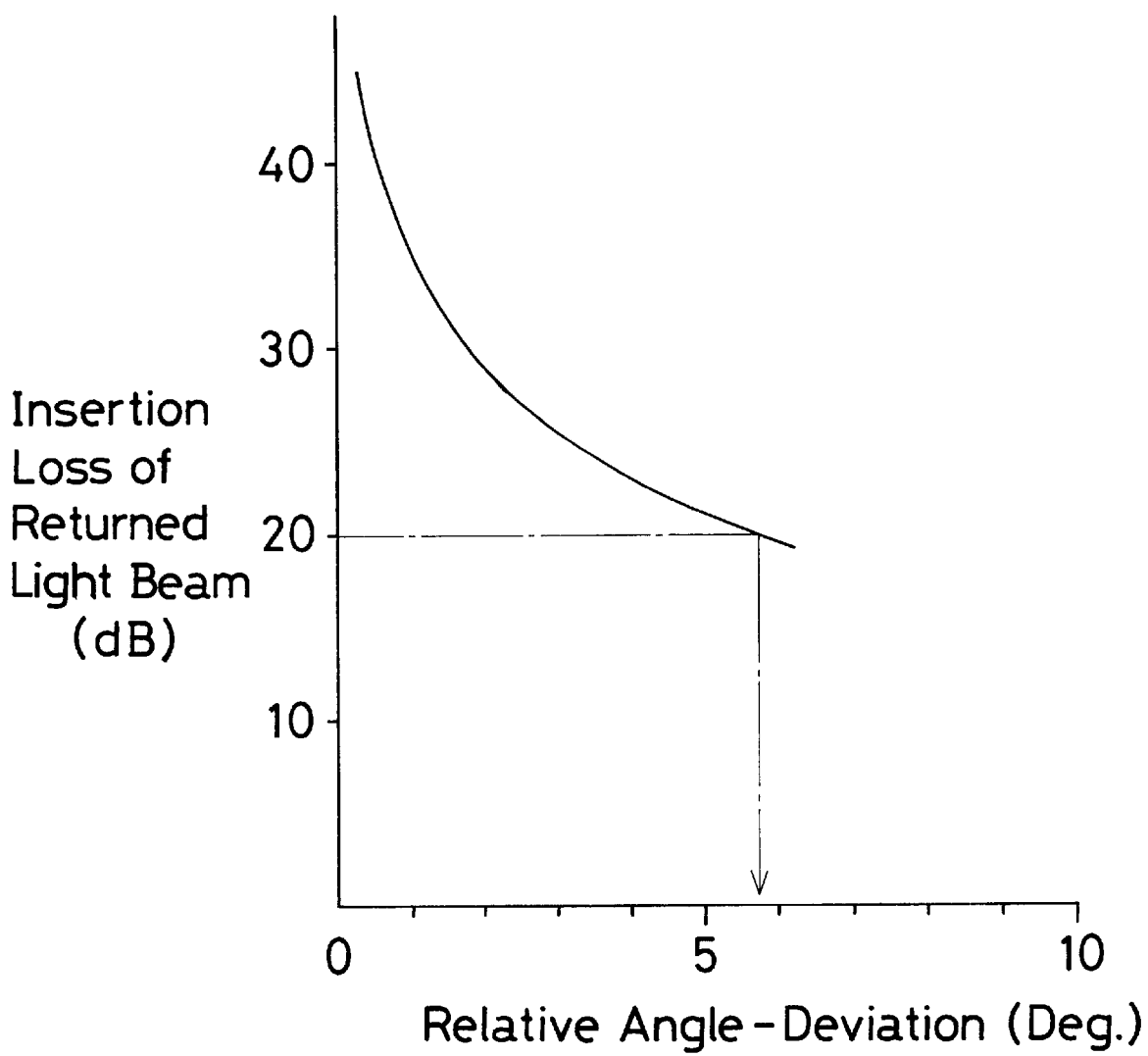

OPTICAL ISOLATOR

This is a continuation of application Ser. No. 08/789,737, filed Jan. 27, 1997, which in turn, is a continuation of application Ser. No. 08/524,832, filed Sep. 5, 1995, which in turn, is a continuation of application Ser. No. 08/207,540, filed Mar. 7, 1994 all abandoned.

BACKGROUND OF THE INVENTION

The present invention relates to an optical isolator which is improved so as to suppress generation of noises.

There has been used, in the recent high speed large capacity communication system, an optical communication system and a semiconductor laser as a light source. In the optical communication system, a light beam emitted from such a semiconductor laser as a light beam to be transmitted for communication is projected on the end face of a fiber through a relay lens and propagates in the fiber. In this case, a part of the transmission light is sometimes reflected by end faces of the fiber and lenses and often returned back to the light source as a returned light beam. The returned light beam generates noises since the oscillation of the semiconductor laser is disturbed when the direction of polarization of the returned light beam is identical to that of the transmission light.

In order to inhibit the generation of any noise, the machinery and tools for optical communication each, in general, comprises an optical isolator directly connected to a light source. The conventional optical isolator generally comprises a hollow cylindrical magnet whose ends are both opened and in which a Faraday's rotator is disposed; a polarizer and an analyzer arranged on the sides of the magnet. Anti-reflection films are formed on these Faraday's rotator, polarizer and analyzer. The Faraday's rotator can turns the polarization direction of a light beam to be transmitted for 45° due to the action of the magnetic field established by the magnet. Moreover, the polarization directions of the polarizer and the analyzer are also turned an angle of 45° relative to one another so as to be in agreement with the rotational angle. A transmission light beam emitted from the light source is first polarized by the polarizer, then the polarization direction thereof is turned 45° by the action of the Faraday's rotator and the light beam passes through the analyzer at an angle of 45° with respect to the polarization direction of the polarizer. In this case, some returned light beams can pass through the analyzer, but the polarization direction thereof is again turned 45° by the Faraday's rotator. For this reason, the overall polarized angle of the returned light is equal to 90°, thus the polarization direction of the returned light is perpendicular to that of the transmission light beam and accordingly, any propagation of the returned light beam is inhibited by the polarizer.

Japanese Utility Model Application Publication No. 1-43873 discloses a semiconductor laser device which comprises a semiconductor laser which emits a linearly polarized light beam and to which garnet is directly fitted as a Faraday's rotator and a collimater lens or condenser lens arranged ahead of the laser tube. Moreover, the technique proposed in Japanese Patent Provisional Publication No. 63-84185 makes use of a Faraday's rotator as a material for the window of a semiconductor laser and is designed in such a manner that a light beam passes through an analyzer after the passage through a lens. In the technique disclosed in Japanese Patent Provisional Publication No. 3-174789, a semiconductor laser is equipped with a cap which comprises a Faraday's rotator and an analyzer. However, this structure suffers from various problems such that the angle adjustment is required even after the semiconductor laser and the cap are integrated and that the cap does not show an ability of completely shielding any reflected light depending on the methods for the connection thereof to the laser.

There has been strongly desired for the miniaturization of optical isolators and the reduction of the production cost thereof. For this reason, the sizes of polarizers and analyzers are also substantially reduced. The same is true for the collimater lens used in the foregoing semiconductor laser device. In case of the conventional optical isolator, the polarization direction of a light beam transmitting through a polarizer should be correctly adjusted with respect to the polarization direction of the light beam transmitting through an analyzer. In this respect, it is very difficult to directly adjusting the position of a quite fine part. Moreover, the polarizer is fine in size, but is not cheap at all and such a built-in polarizer substantially increases the size of the optical isolator.

Japanese Utility Model Application Publication No. 1-43873 discloses a semiconductor laser device which comprises a semiconductor laser having a linear polarization plane and an optical isolator which are continuously formed without any clear distinction. However, it is very difficult to directly adjusting the angle of the collimater lens with respect to the polarization direction of the transmission light beam. This makes the mass-production thereof in an industrial scale difficult.

In the technique disclosed in Japanese Patent Provisional Publication No. 63-84185, a diffusing light beam is incident upon a magneto-optical element. Therefore, the magneto-optical element must have a large diameter. This leads to an increase in the cost for the materials required and correspondingly, makes the resulting isolator unit expensive. Besides, the structure or shape as shown in the attached figure of this article makes the angle-control of the analyzer difficult. In general, the angle of a polarization-optical system is adjusted while making the reflected light incident upon the optical system in order to achieve desired functions of the optical isolator, but the adjustment becomes impossible when the semiconductor laser is equipped with the Faraday's rotator. Further, the technique disclosed in Japanese Patent Provisional Publication No. 3-174789 requires the use of a magneto-optical element having a large diameter, but this leads to an increase in the cost for the materials required and correspondingly, makes the resulting isolator unit expensive. In addition, it is difficult to fit the isolator unit to the semiconductor device and to perform the alignment thereof.

SUMMARY OF THE INVENTION

It is an object of the present invention to provide an optical isolator which permits the solution of the foregoing problems, which shows a high S/N ratio (S: quantity of signals; N: quantity of noises), is cheap and which can be miniaturized to such a size that it can easily be incorporated into a laser module.

The optical isolator according to the present invention is one to be connected to a semiconductor laser having a linear polarization plane and comprises a Faraday's rotator and a magnetic material for establishing a magnetic field around the rotator on the light-incident side thereof as well as an optical material for polarization on the light-outputting side. In particular, the optical isolator of the present invention is one to be connected to a semiconductor laser having a linear polarization plane while aligning a polarization direction guide of the isolator with the semiconductor laser, comprises a Faraday's rotator whose light-incident and -outputting faces are preferably inclined with respect to the optical path and an annular magnetic material surrounding the rotor on the light-incident side and an optical material for polarization, on the light-outputting side, whose light-incident and -outputting faces are preferably inclined with respect to the optical path, and the optical material for polarization is more preferably made of a metal-dispersed glass material.

If the optical isolator of this invention is connected to a semiconductor laser, it is not necessary to directly touch a fine element with hands and adjust the orientation thereof, but the inclination of the optical isolator should be taken into consideration. This makes the operations substantially simple and easy. Any polarizer is not present within the optical isolator of the invention and this, accordingly, permits the reduction of the optical path length. Therefore, the isolator has a sufficiently high S/N ratio (S: quantity of signals; N: quantity of noises) and a reduction of the production cost and can thus be miniaturized to such a size that it can easily be incorporated into a laser module.

Moreover, if a condenser lens is incorporated into a semiconductor laser so that the light beam emitted from the laser is converted into a parallel light beam or a converged light beam before it is incident upon the optical isolator, optical parts such as a Faraday's rotator and an analyzer can be miniaturized to reduce the production cost thereof. This further makes the adjustment of the inclination angle easy.

BRIEF DESCRIPTION OF THE DRAWINGS

FIG. 4 is a diagram illustrating the relation between the insertion loss of returned light beams and the relative angle.

DETAILED DESCRIPTION OF THE INVENTION

Figure 1:
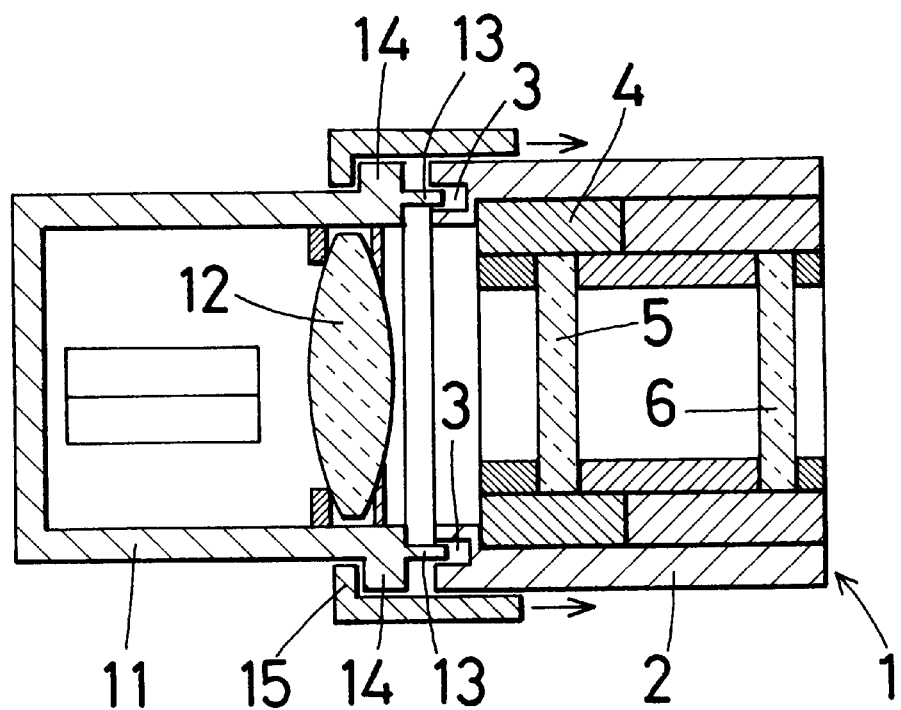
FIG. 1 is a cross sectional view for illustrating an embodiment of the optical isolator according to the present invention.

The optical isolator according to the present invention will be explained in more detail with reference to the accompanying FIG. 1 showing an embodiment thereof.

The optical isolator according to the present invention is an isolator 1 to be connected to a semiconductor laser 11 having a linearly polarized plane and comprises a Faraday's rotator 5 and a magnetic material 4 for establishing a magnetic field around the rotor 5 on the light-incident side thereof as well as an optical material 6 for polarization on the light-outputting side. In particular, the optical isolator 1 of the present invention is one to be connected to a semiconductor laser 11 having a linear polarization plane while aligning a polarization direction-guide 3 of the isolator with the laser 11, comprises a Faraday's rotator 5 whose light-incident and -outputting faces are preferably inclined with respect to the optical path and an annular magnetic material 4 surrounding the rotor 5 on the light-incident side and an optical material 6 for polarization, on the light-outputting side, whose light-incident and -outputting faces are preferably inclined with respect to the optical path, and the optical material 6 for polarization is more preferably made of a metal-containing glass material.

The optical isolator 1 according to the present invention comprises the built-in optical material 6 for polarization and correspondingly, has a size greater than that of the fine optical material 6 for polarization. When the optical isolator 1 is connected to a semiconductor laser 11, it is not necessary to directly handle a fine element and adjust the orientation thereof, but the inclination of the optical isolator 1 should be taken into consideration. This makes the operations required for the connection easy.

Any polarizer is not present within the optical isolator 1 of the present invention and this, accordingly, permits the reduction of the optical path length in proportion thereto. The presence of the polarization direction-guide 3 makes, more easier, the adjustment of the predetermined polarization direction. If the light-incident and -outputting faces of the Faraday's rotator 5 are inclined with respect to the optical path of the laser 11, the quantity of the light beam reflected by these faces of the Faraday's rotator 5 and returned back to the laser 11 can be further reduced since the direction of the light beam reflected by these faces would deviate from the optical path of the laser 11. The optical path length can further be reduced when the optical material 6 for polarization is prepared from a metal-containing glass material such as those obtained by, for instance, drawing silver-containing glass under stress for arranging the silver particles along the direction of the stress applied and for thus imparting polarizability to the resulting material.

Working Examples of the present invention will be detailed below, but the present invention is not limited to these specific Examples.

FIG. 1 is a cross sectional view showing the optical isolator 1 according to the present invention and a semiconductor laser 11 capable of emitting a linearly polarized light beam to which the isolator is connected.

The semiconductor laser 11 connected to the optical isolator 1 comprises a condenser lens 12 on the light-emitting side thereof, upper and lower guide projections 13 positioned on the end face and an annular flange 14 formed around the outer peripheral edge of the laser 11. The semiconductor laser 11 is covered by an annular cap 15 for connection and the annular cap 15 is pressed against the flange 14 and extends towards the light-emitting direction of the laser 11 so that it can engage with an isolator tube 2.

Figure 2:
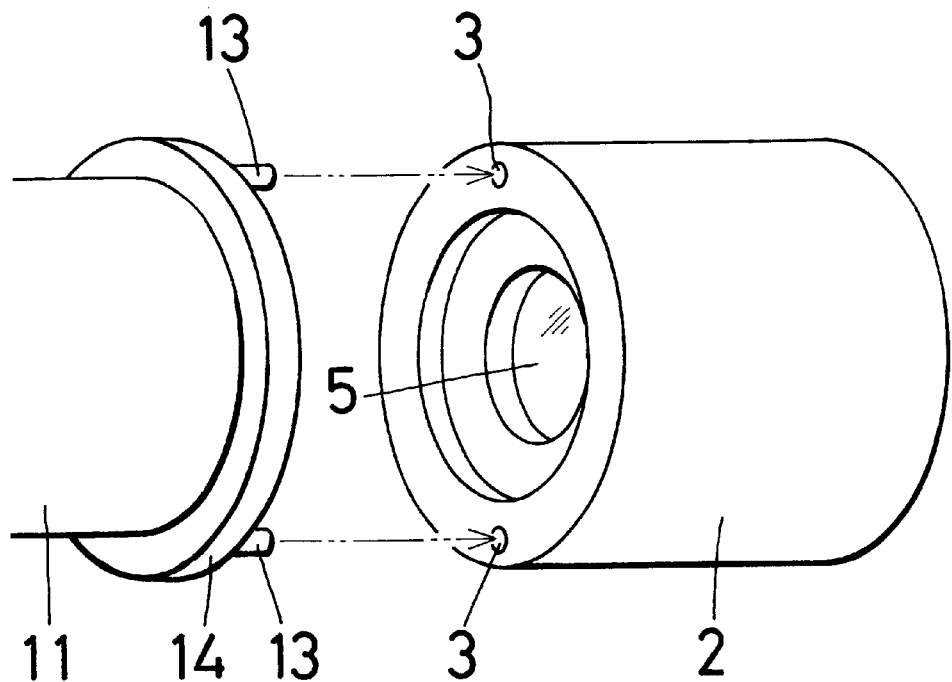
FIG. 2 is a perspective view of an isolator tube of the embodiment shown in FIG. 1 viewed from the light-incident side.

The optical isolator 1 is accommodated in the isolator tube 2. An optical path is formed within the isolator tube 2 and the outer periphery thereof on the light-incident side is joined to the annular cap 15 for connection through the YAG laser welding. FIG. 2 shows a perspective view of an isolator tube 2 of the embodiment shown in FIG. 1 viewed from the light-incident side. The isolator tube 2 has upper and lower guide holes 3 for specifying the polarization direction formed on the light-incident end face thereof and each of the foregoing guide projections 13 is inserted into each corresponding guide hole 3 for specifying the polarization direction.

The optical isolator 1 is equipped with a built-in cylindrical hollow magnet 4 on the light-incident side of the isolator, the magnet 4 can thus establish a magnetic field within the isolator and the Faraday's rotator 5 is accommodated in the magnet 4. The Faraday's rotator 5 is provided with an anti-reflection film on the surface and the rotational angle of the polarization plane is set at 45°. An optical material 6 for polarization is covered with an anti-reflection film and fitted to the optical isolator on the light-outputting side thereof. The material 6 is prepared from a metal-dispersed glass material by drawing, for instance, a silver-containing glass material under the application of a stress for orientating the silver particles present therein along the direction of the stress applied and for thus imparting polarizability to the resulting material. The direction of the polarized light beam which can transmit through the material 6 is adjusted in such a manner that the direction is inclined 45° relative to the polarization direction of the linearly polarized light beam which is emitted from the semiconductor laser 11.

When the semiconductor laser 11 is connected to the optical isolator 1, the laser 11 is engaged with the optical isolator 1 so that the guide projections 13 of the laser 11 are inserted into the guide holes 3 of the isolator 1 for specifying the polarization direction and then a laser beam emitted from a YAG laser is focused on the annular cap 15 for connection to weld the cap 15 and the isolator tube 2 and to thus connect the isolator 1 to the laser 11.

An optical system is connected to the isolator 1 on the light-outputting side and then the semiconductor laser 11 oscillates and emits a linearly polarized light beam. This transmission light beam is first rotated by the Faraday's rotator 5 and then passes through the optical material 6 for polarization. However, a part of the light beam reflected back towards the laser 11 through the optical system generates almost no noise since the polarization direction thereof deviates 90° from that of the light beam emitted from the laser 11.

This embodiment is provided with a guide hole 3 for specifying the polarization direction and correspondingly, the optical isolator can easily be connected to a semiconductor laser 11 in good alignment with each other. The operation for connecting these devices becomes easier if the guide hole 3 for specifying the polarization direction is formed somewhat large in size.

Figure 3:
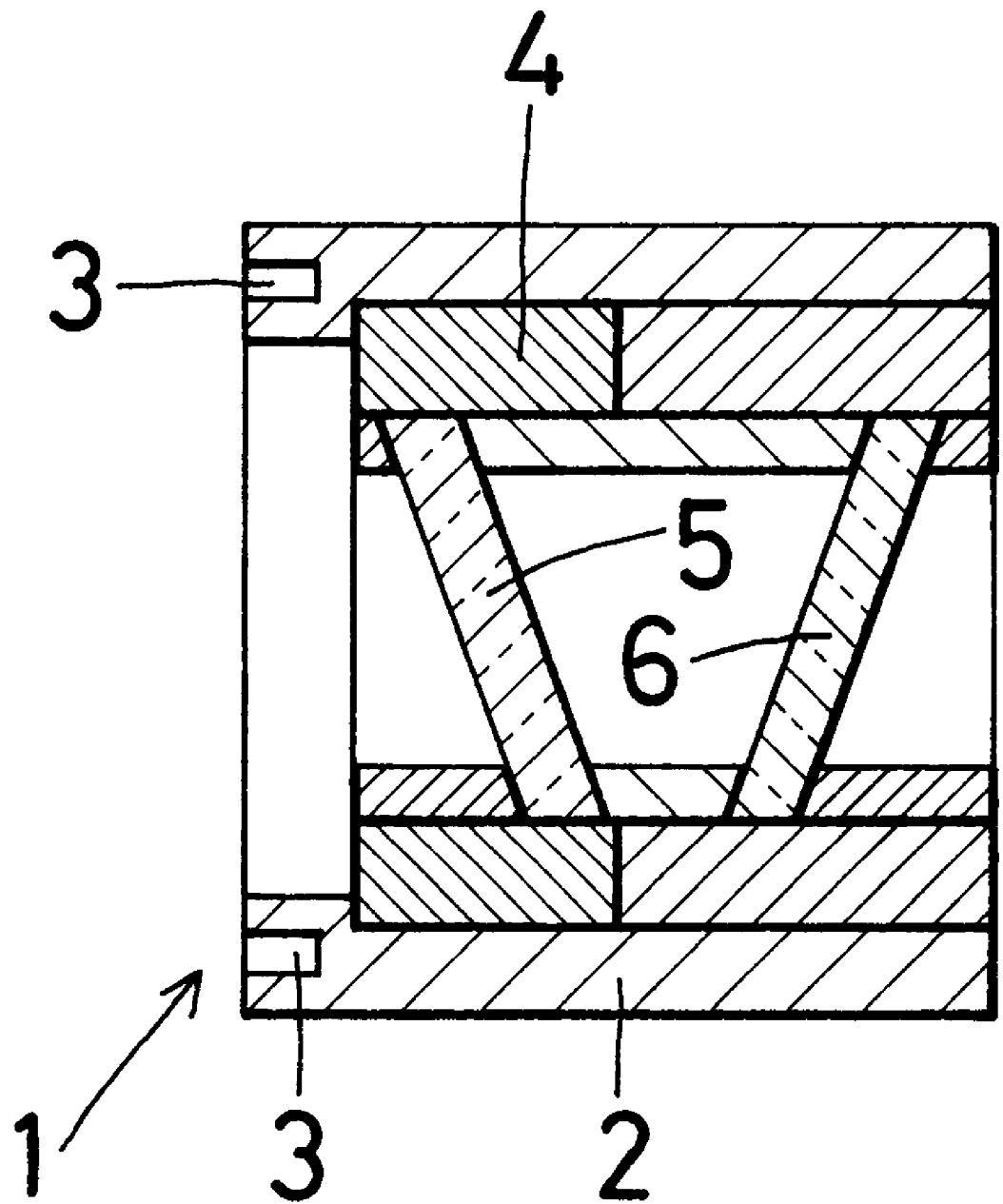
FIG. 3 is a cross sectional view for illustrating another embodiment of the optical isolator according to the present invention.

FIG. 3 shows another embodiment of the optical isolator of the present invention. In this embodiment, the light-incident and outputting faces of the Faraday's rotator 5 and the optical material 6 for polarization are both inclined with respect to the optical path of the beam emitted from the laser. The direction of the light beams reflected by these light-incident and outputting faces deviates from the optical path of the linearly polarized light beam and the generation of noises can further be reduced, through the inclination of these faces.

An optical fiber was connected to the optical isolator 1 whose Faraday's rotator 5 and optical material 6 for polarization had been both inclined on the light-outputting side and a semiconductor laser 11 oscillated and emitted a linearly polarized light beam to be transmitted through the isolator. At this stage, the insertion loss of returned light beams observed when the optical isolator 1 was rotated with respect to the semiconductor laser 11 was determined using a germanium photodiode having a light-receiving diameter Φ of 5 mm. It was thus found that the insertion loss of the returned light beams should be not less than 20 dB in order to ensure a sufficiently high ratio of the quantity of signals to that of noises, S/N. The results thus obtained are plotted on the graph shown in FIG. 4 wherein the relative angle-deviation between the polarization direction of the linearly polarized light beam and that of the light beam transmitting through the optical material 6 for polarization is plotted as abscissa and the insertion loss of the returned light beams as ordinate.

The results plotted on the graph shown in FIG. 4 clearly indicate that the insertion loss of the returned light beams can be controlled to a level of not less than 20 dB if the relative angle-deviation defined above can be limited to not more than 5.7°. Incidentally, if the guide hole 3 for specifying polarization direction is large, the angle of inclination of the light-incident and -outputting faces somewhat deviates from the predetermined value. As has been discussed above, however, the precision of the optical isolator is not influenced by such a slight deviation if the relative angle-deviation is not more than 5.7°.

What is claimed is:

1. An optical isolator which is connected to a semiconductor laser having a linear polarization plane of its emitted light beam the optical isolator consisting essentially of a Faraday's rotator having a light-incident side and a light-outputting side, a magnetic material for establishing a magnetic field around the rotator on the light-incident side, and a single polarizer on the light-outputting side of the Faraday's rotator, and guide holes, wherein the optical isolator is connected to the semiconductor laser through guide projections of the semiconductor laser being inserted into the guide holes for maintaining a relative angle-deviation between the polarized direction of the linear polarized emitted light beam and the light beam transmitted through the single polarizer to not more than 5.7 degrees.

2. The optical isolator as set forth in claim 1 wherein the polarizer is made of a metal-containing glass material.

3. The optical isolator as set forth in claim 1, wherein the Faraday's rotator has a light-incident face and a light-outputting face, the polarizer has a light-incident face and a light-outputting face, and the light-incident and light-outputting faces of the Faraday's rotor and the polarizer are inclined with respect to a path traveled by the light beam through the optical isolator.

4. The optical isolator as set forth in claim 3 wherein the polarizer is made of a metal-containing glass material.

5. The optical isolator as set forth in claim 3, wherein the light-incident and lightioutputting faces of the Faraday's rotator and the polarizer are parallel to each other.

* * * * *